United States Patent [19]

Schrenk

[11] 4,209,849

[45] Jun. 24, 1980

[54] NON-VOLATILE MEMORY WHICH CAN BE ERASED WORD BY WORD CONSTRUCTED IN THE FLOATING GATE TECHNIQUE

[75] Inventor: Hartmut Schrenk, Haar, Fed. Rep. of Germany

[73] Assignee: Siemens Aktiengesellschaft, Fed. Rep. of Germany

[21] Appl. No.: 942,320

[22] Filed: Sep. 14, 1978

[30] Foreign Application Priority Data

Sep. 27, 1977 [DE] Fed. Rep. of Germany ....... 2743422

[51] Int. Cl.² .............................................. G11C 11/40
[52] U.S. Cl. .................................... 365/182; 307/238;
357/23; 365/184; 365/218
[58] Field of Search ............... 365/182, 184, 185, 218;
307/238; 357/23, 59, 41

[56] References Cited

U.S. PATENT DOCUMENTS

| 3,651,490 | 3/1972 | Onoda et al. | 365/185 |
|---|---|---|---|
| 3,996,657 | 12/1976 | Simko | 340/173 |
| 4,087,795 | 5/1978 | Rossler | 365/185 |
| 4,099,196 | 7/1978 | Simko | 365/185 |
| 4,112,509 | 9/1978 | Wall | 365/185 |

Primary Examiner—Terrell W. Fears

Attorney, Agent, or Firm—Hill, Van Santen, Steadman, Chiara & Simpson

[57] ABSTRACT

A semiconductor memory is disclosed having a plurality of individual semiconductor storage cells. Each cell has at least one field effect transistor with a floating storage gate entirely surrounded by an insulating layer. An additional insulated control gate is provided above the storage gate. Discharge of the floating storage gate occurs by a direct transfer of electrons from the floating gate through the insulating layer under the influence of a strong electric field. Programming of the field effect transistor wherein the floating gate is charged occurs by the same physical mechanism as erasure of the field effect transistor. The transfer of electrons during programming and erasure occurs at the same transfer region of the insulating layer but in opposite directions. The electrons which are transferred during programming and erasure have the lattice temperature. A capacitance between the control gate and the floating gate is high relative to a capacitance between the floating gate and the substrate. With the semiconductor memory disclosed, technical difficulties arising from charging and discharging floating storage gates by different physical mechanisms are substantially eliminated.

24 Claims, 3 Drawing Figures

NON-VOLATILE MEMORY WHICH CAN BE ERASED WORD BY WORD CONSTRUCTED IN THE FLOATING GATE TECHNIQUE

BACKGROUND OF THE INVENTION

The invention relates to a memory constructed from a plurality of individual memory cells each comprising at least one field effect transistor having a memory gate which is enclosed all round by an insulating layer and is electrically floating. The transistor also has a further insulated gate, in particular an insulated, controllable control gate, wherein the erasure of the field effect transistor, i.e. the discharge of the floating gate, is carried out by means of a direct transfer of electrons from the floating gate through the insulating layer under the effect of a strong, connected electric field.

Such semiconductor memories are known whose individual memory cell contains at least one MOS field effect transistor which, in addition to a normal gate electrode, contains a so-called floating gate, an electrode which is capacitively coupled to the controllable gate of the transistor and which possesses neither an outer terminal nor a connection to the control gate electrode. The floating gate is separated from a conductive zone of the semiconductor body which is to be supplied by outer terminals only by an oxide layer which is so thin that when sufficiently "high" voltages are connected, a transfer of charge to and from the floating gate can occur. The charge stored in the floating gate represents the information which is stored in the cell and which experiences no change under normal operating voltages such as are used to read-out the memory. On the other hand, the "high" voltages are used for programming and for erasure. The term "high" voltage indicates that the voltage should be selected to be such that the exchange of charge between the floating gate and semiconductor body can take place without destroying the oxide layer lying therebetween, and in fact by a tunnel effect. There are many possible ways of effecting this, namely by using the so-called Fowler-Nordheim field emission.

U.S. Pat. No. 4,087,795 discloses an electronic memory having a plurality of electrically programmable storage field effect transistors which each possess an insulated, floating storage gate and a controllable control gate, wherein the erasure of the memory and the discharge of the floating gate are carried out by electrical means, and in fact by means of an erasing voltage supplied between the control gate and the channel path. The programming of the memory, i.e. the charging of the floating storage gate is carried out on the other hand at a different position in the field effect transistor and also with a different physical mechanism, namely by means of channel injection. For this purpose charge carriers are accelerated in a short channel and the so-called hot charge carriers are conveyed to the storage gate with the aid of an additional electrical transverse field.

With this method of recording and erasing in memories, i.e. the charging and discharging of floating storage gates by means of different physical mechanisms, there are a series of technical difficulties which lead to disadvantages in the memory produced by the method.

First the insulating layer thickness in the erasing zone of these memory cells cannot be arbitrarily selected. In order to simplify the dimensioning of the peripheral electronics and the voltage supply and simultaneously to reduce the power loss, on the one hand it would be desirable to reduce the erasing voltage by reducing the insulating layer thickness in the erasing zone. On the other hand, on account of the danger of the disturbance of neighboring words, it should be ensured that the erasing voltage does not come into the order of the programming voltages (e.g. $U_g = 15$ V). In this case, for example, when a "1" is written in by means of channel injection into a selected memory cell, a "1" would also be entered in those memory cells which, although they have no channel current flowing therein, exhibit a sufficiently high voltage between their floating gates and associated channel zones so that the corresponding floating gates are charged by means of the Fowler-Nordheim effect through the thin insulating layer in the erasing zone. Misprogramming of this type is also promoted by the technologically dependent tolerance fluctuations in the insulating layer thicknesses.

Secondly, programming with hot charge carriers by avalanche injection or channel injection always requires a current between the two diffusion zones and between a diffusion zone and the substrate. This current is considerably greater than the actual recharging current of the floating storage gate and gives rise to additional problems during word-wise programming of e.g. 8 to 16 bits. The resulting disadvantages consist, for example, of a shorter life duration, higher power losses, higher current requirements on the mains components and an increase in the dimensions of the peripheral electronics.

Furthermore when hot charge carriers are used to record or to erase, the danger of walkout problems always exists which increase the erasing and progamming duration of such memories and reduce the life duration.

SUMMARY OF THE INVENTION

Therefore, an object of the present invention is to provide a memory and a process for programming and word-wise erasing of the store in which the memory possesses a high resistance to interference and is independent of process tolerances, for example fluctuations in layer thickness of the insulator, and the store possesses approximately uniformly short erasing times even in the case of a large number of record-erase cycles. At the same time there is to be a simplification of the current supply and a reduction in the electric power required for reprogramming.

This object is realized in memories comprising a plurality of memory cells each having at least one field effect transistor wherein the erasure of the memory, i.e. the discharge of the floating gate contained in the field effect transistors, is carried out by means of a direct transfer of electrons from the floating gate through the insulating layer under the influence of a strong connected electrical field. The programming of the field effect transistor, i.e. the charging of the floating gate, is carried out by means of the same physical mechanism as is the erasure of the field effect transistor, i.e. the discharge of the floating gate, by means of a high voltage of suitable polarity between the storage gate and the substrate. The transfer of electrons during programming and erasure is in each case carried out at the same points of the insulating layer although in opposite directions, wherein the electrons which are transferred during programming and erasure possess the lattice temperature. The capacitance between control gate and floating gate is high relative to the capacitance between the floating gate and channel zone and between the floating gate and substrate at the point at which the transfer of electrons takes place.

It is advantageous to carry out the programming and erasure of field effect transistors, ie. the charging and discharging of the floating gates, by means of the same physical mechanism and at the same point in the insulating layer, since this causes tolerance fluctuations to influence the programming and erasure processes equally. As the pollution of the insulator is caused mainly by the trapping of hot holes in traps in the insulator, it is also particularly advantageous to use charge carriers at lattice temperature for erasing and for programming. By reducing or avoiding the pollution of the insulator, it is possible to maintain the recording and erasing time of the memory approximately constant even over a plurality of record-erase cycles.

It is advantageous for those points of the insulating layer of the field effect transistors at which the electrons are transferred during the charging and discharging of the floating gate—the record-erase windows—to have a smaller layer thickness than the remainder of the insulating layer, in particular a smaller layer thickness than the remainder of the insulating layer in the channel zone of each associated field effect transistor.

A reduction in the insulating layer thickness at the record-erase window results in a corresponding reduction in the record-erase voltage to be connected between floating gate and substrate and a reduction in the record-erase times, although the other parts of the field effect transistor retain equally good insulating properties. A simplification of the peripheral electronics and voltage supply also occurs.

It is particularly favorable for the insulating layer in the record-erase window to have a layer thickness of 200 Å to 700 Å, whereas the other parts of the insulating layer, in particular in the channel zone of the associated field effect transistor, have a layer thickness of 800 Å to 1200 Å.

A further development of the invention consists in that the record-erase window is arranged inside or outside the channel zone of a field effect transistor between source or drain on the one hand and floating gate on the other hand.

An erasing window arranged outside the channel zone has the advantage of not influencing the electrical properties of the field effect transistor.

On the other hand, a record-erase window arranged inside the channel zone has the advantage of simpler production and a smaller semiconductor chip area.

It is advantageous for the insulating layer to consist of an oxide and/or nitride of the semiconductor material used as substrate.

The use of oxides and/or nitrides of the relevant semiconductor substrate by way of an insulator substantially simplifies the production process of field effect transistors and is therefore advantageous.

It is also advantageous for the floating storage gate to consist of semiconductor material, in particular doped, polycrystalline semiconductor material.

Apart from simplifying the production process of semiconductor transistors produced in this way, floating storage gates consisting of doped, polycrystalline semiconductor material are also particularly advantageous since semiconductor material can be surrounded by a particularly good electrical insulating layer and at the same time withstands high production temperatures.

A further development of the invention consists in that the control gate consists of semiconductor material such as doped, polycrystalline semiconductor material or a metal, in particular aluminum.

It is further advantageous for the individual field effect transistors having a N or P channel to be monolithically integrated into a semiconductor substrate, for example a silicon substrate. The production of memories monolithically integrated in a semiconductor substrate has all the advantages provided by integrated circuits, thus for example simple production or miniaturization of corresponding storage arrangements.

Another inventive feature consists in that each memory cell possesses a split gate structure, i.e. each field effect transistor, equipped with a floating storage gate, of a memory cell is electrically connected in series with a further MOS transistor, and the MOS transistor is likewise switched via the control gate.

The advantage of a cell designed in the split gate structure consists in a correct read out of the recorded information. The additional series-connected MOS transistor component prevents storage cells from entering the depletion state in the event of over-erasure and falsifying the read-out process.

It is further advantageous for the lines which serve to connect the control gates—the gate lines—to be operated word-wise, whereas the lines which serve to connect the source—the source lines—and likewise the lines which serve to connect the drain—the drain lines—to be operated bit-wise.

This type of operation has the advantage that by using suitable potentials on the individual lines, for example, as quoted in the table and in the description, it is possible to achieve a simple erase and record process and at the same time to virtually eliminate the disturbance of neighboring words or neighboring bits. Thus a "1" and a "0" can be effortlessly recorded side by side in a selected word.

It is further advantageous that either the bit-wise operated lines should consist of aluminum and the word-wise operated lines should consist of doped, polycrystalline silicon, or that the bit-wise operated lines should consist of diffusion paths and the word-wise operated lines should consist of aluminum, since production processes of this type can be technically easily handled by means of photolithographic procedures.

It is also advantageous to connect the potential $U_G=0$ V to the gate line of a selected word during the erasure thereof, but to connect a high positive voltage $U_P$ to the source lines as this process enables the memory to be erased word-wise.

Another feature of the invention consists in that with an insulating layer thickness of 200 Å to 700 Å at the record-erase window, $U_P=20$ V to 40 V.

Another feature of the invention consists in that the voltages connected to the gate lines and source lines of the selected and nonselected words are not selected independently of one another. This measure avoids the disturbance of neighboring words or neighboring bits during the programming of the memory.

A feature of the invention consists in that in order to record a "1" or a "0" in the individual memory cells of a selected word, the gate line of the selected word is in each case fed with a high, positive voltage $U_P$, whereas the gate lines of the non-selected words are fed with $\frac{1}{3} U_P$ and at the same time, in order to record a "1" in a storage cell, a potential $U_S=0$ is connected to the associated source line and in order to record a "0" into a storage cell the potential $U_S = \frac{2}{3} U_P$ is connected to the associated source line.

Advantages of stores corresponding to the invention consist in the possibility of word-wise electrical erasure, slight disturbance of neighboring words, low dependence upon process tolerances, for example insulating layer thickness fluctuations and operating voltage fluctuations, simple construction, non-critical design rules, minimal currents (as the information is recorded without channel current) and small dimensions of the peripheral electronics.

The area requirement of a two-transistor cell in a memory corresponding to the invention amounts to approximately 1000 $\mu m^2$. Short memory channel lengths are unnecessary in transistors of memories corresponding to the invention on account of their function.

DESCRIPTION OF THE PREFERRED EMBODIMENT

Figure 1:
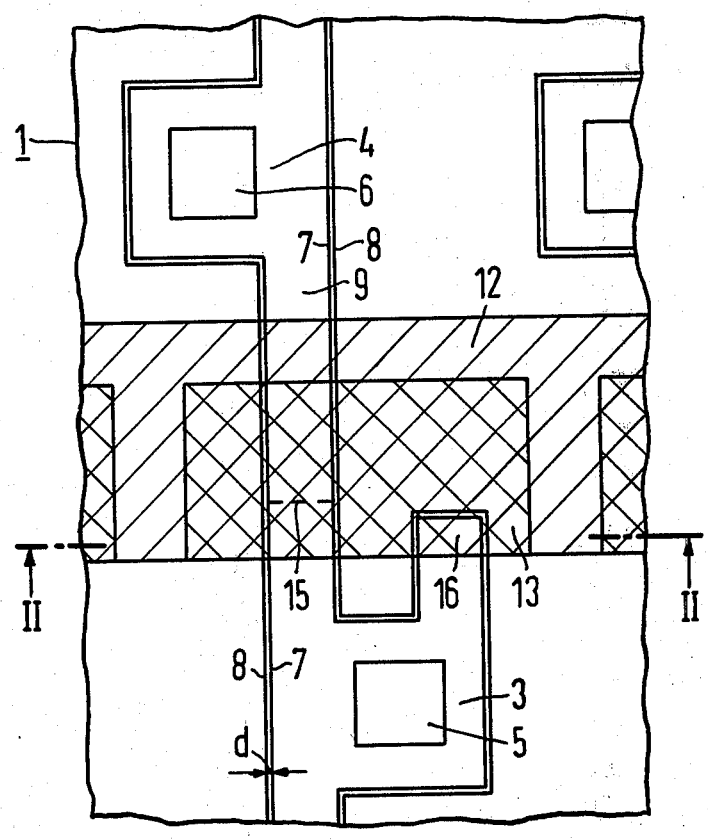
FIG. 1 is a plan view of a memory cell having a split gate structure.

FIG. 1 is a plan view of a memory cell 1 having a split-gate structure, wherein, for reasons of clarity, contact paths on the surface have not been illustrated, and the control gate 12 has been provided with single shading and the floating gate 13 with double shading. A double line consisting of the lines 7 and 8 indicates the edges of an oblique recess 9 in the first insulating layer which extends down into the insulator to the surface of the semiconductor substrate. Considered in a plan view of the memory cell 1, the lines 7 and 8 are spaced by the distance d. A polycrystalline, doped semiconductor gate is arranged over parts of the recess 9 as a floating gate 13, the floating gate 13 being electrically insulated from the semiconductor substrate by means of a thin, second insulating layer. The drain zone 4 and the source zone 3 are diffused into the semiconductor substrate within the recess 9. During a diffusion process of this type, the polycrystalline control gate 12 and the first insulating gate arranged outside the recess 9 serves as a diffusion mask, for which reason the semiconductor substrate exhibits no semiconductor doping beneath the first insulating layer and beneath the control gate 12, apart from a narrow under-diffusion zone. The zone 16 forms the record-erase window which in this case lies outside the channel zone of the field effect transistors of the storage cell 1. As an alternative, the record-erase window can also lie inside the channel zone as the zone 15 indicates in broken lines. The transfer of charge within the record-erase window is preferably carried out in the region of the underlying doping boundary. The source-side contact window 5 and the drain-side contact window 6 lead from the outermost insulator surface through to the doped semiconductor zones and serve to contact the zones. The control gate 12 is arranged above the floating gate 13, electrically insulated from the latter, in such a way that in the direction of the drain zone 4 it overlaps the floating gate 13 and the regions between the floating gates 13 of adjacent memory cells.

The dash-dotted line II—II represents a sectional plane through the storage cell 1 at right angles to the drawing plane.

Figure 2:
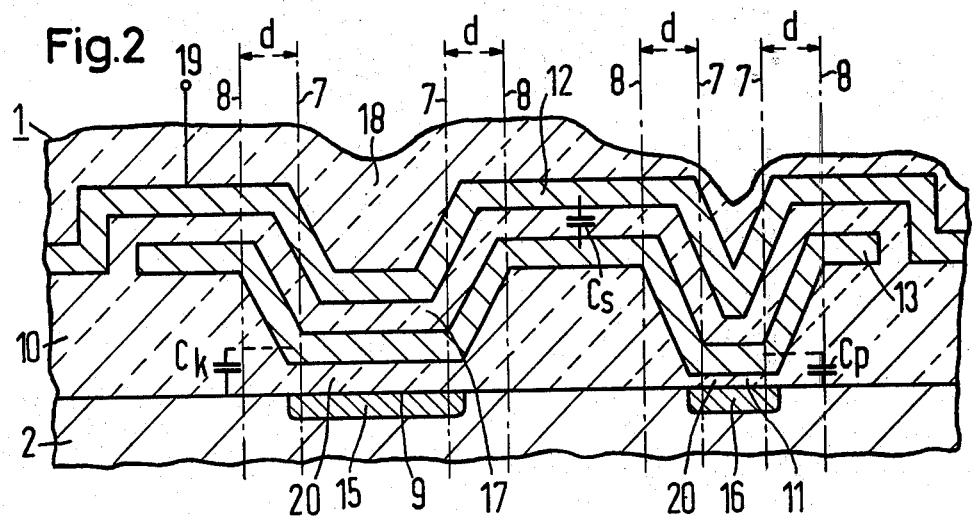
FIG. 2 is a cross-section through a memory cell corresponding to FIG. 1 along the line II—II in FIG. 1.

FIG. 2 is an enlarged cross-section through a storage cell 1 corresponding to FIG. 1, wherein the cross-sectional area runs at right angles to the drawing plane of FIG. 1 along the dash-dotted line II—II from FIG. 1. The semiconductor substrate 2 contains a narrow under-diffusion zone which has been provided only in the zones 15 and 16 and in which a record-erase window can be alternatively arranged. The semiconductor substrate 2 is partially coated with a first insulating layer 10. Inside the zone 16, i.e. in the record-erase window 11, a particularly thin, second insulating layer 20 having a layer thickness of 200 Å to 700 Å is arranged between floating gate 13 and semiconductor substrate 2. The layer thickness of the second insulating layer 20 in the channel zone between the floating gate 13 and the substrate 2 amounts to 1000 Å to 1200 Å. A third insulating layer 17 is arranged above the floating gate 13 and the control gate 12 is arranged above said insulating layer 17. The control gate 12 is provided with an electrical contact which leads outwards, as schematically indicated in FIG. 2 by the terminal 19. With the exception of the terminal 19, the control gate 12 is insulated from the exterior by a fourth insulating layer 18.

The significance of d has already been explained with reference to FIG. 1. The capacitance between the floating gate 13 and the channel zone is referenced $C_K$.

The capacitance within the erasing window 11 between floating gate 13 and underlying silicon is referenced $C_P$. $C_S$ is the capacitance between the control gate 12 and the floating gate 13. In the memory corresponding to the invention $C_S$ has been selected to be high both relative to $C_P$ and relative to $C_K$.

As a result of the memory capacitive coupling between control gate 12 and floating gate 13, these gates possess approximately the same electrical potential. If a positive DC voltage of approximately 30 V–40 V is connected to the control gate 12, whereas the source zone 3 and the drain zone 4 are connected to earth, as a result of the strong electrical field, electrons pass from the zone 16 through the overlying, thin insulating layer 20 into the floating gate 13. The floating gate 13 is thereby charged. The discharge of the floating gate 13 is carried out similarly to the charging by reversing the polarity of the voltage between source and drain zones on the one hand and control gate 12 on the other hand.

The semiconductor substrate 2 can consist, for example, of weakly p doped silicon semiconductor material, whereas the doped-in source and drain zones are n+ doped. The floating gate 13 generally consists of doped, polycrystalline silicon, and the control gate 12 can optionally consist likewise of doped polycrystalline silicon or of aluminum. When silicon is used as substrate material, the first insulating layer 10, the second insulating layer 20 and the third insulating layer 17 generally consist of silicon dioxide and/or silicon nitride. The fourth insulating layer 18 consists, for example, of a protective glass. However, in the case of a control gate composed of polycrystalline silicon, the fourth insulating layer 18 can likewise consist of silicon dioxide and/or silicon nitride.

Figure 3:
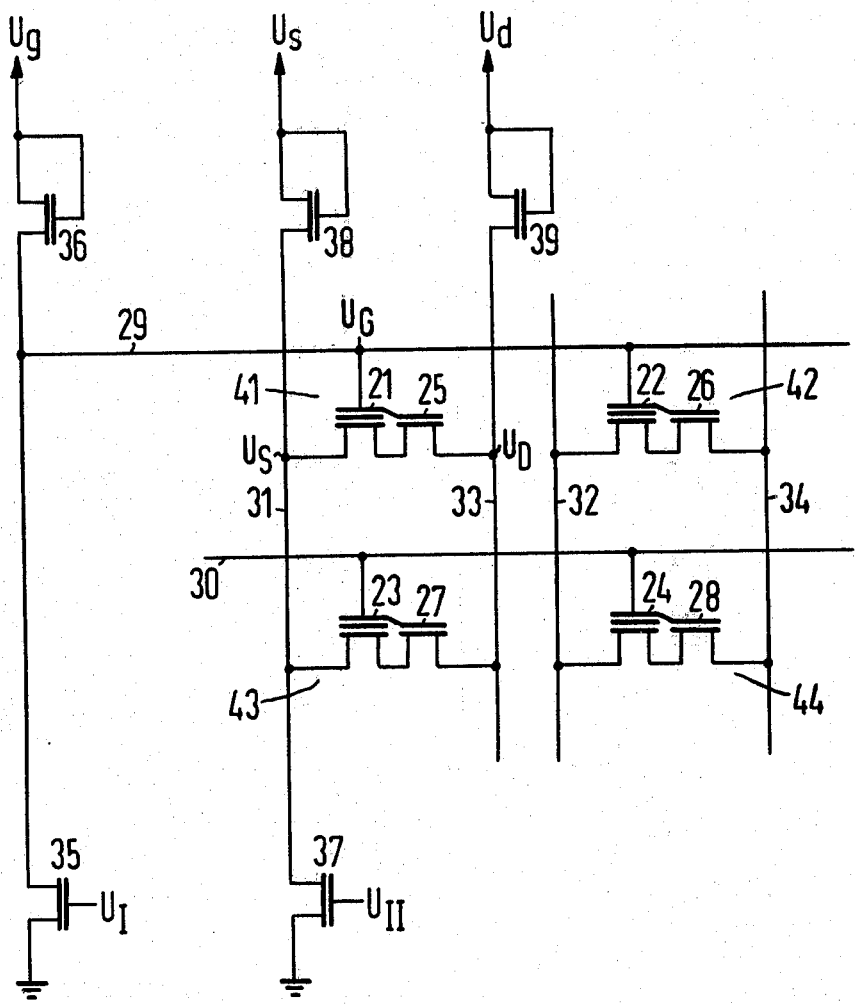
FIG. 3 is a circuit diagram of a memory corresponding to the invention.

FIG. 3 is a circuit diagram of a memory corresponding to the invention. Four memory cells 41, 42, 43 and 44 are represented in a matrix arrangement. The field effect transistor 21 having a floating gate in FIG. 1 is formed as a result of the cooperation of source and drain with the floating gate and the control gate. A field effect transistor 25 without a floating gate is produced in FIG. 1 by the cooperation of source and drain in that channel zone which is covered only by the control gate, not, however, by the floating gate. The series connection of the field effect transistor 21 and 25 is effected in FIG. 1 by means of the feed-through control gate 12 which overlaps the floating gate in the direction of the drain zone. The memory cells 42, 43, and 44 correspond identically to the memory cell 41. The field effect transistors 22, 23, 24 each correspond to the field effect transistor 21 having a floating gate, whereas the field effect transistors 26, 27, 28 correspond to the field effect transistor 25 without a floating gate. As the entire memory drive system can be described by means of the represented cells 41, 42, 43 and 44, other memory cells have not been illustrated. The illustrated gate lines 29 and 30 of the memory corresponding to the invention run word-wise, whereas the source lines 31 and 32 and the drain lines 33 and 34 run bit-wise. The gate line 29 is operated by voltage in that a field effect transistor 36 is fed with a voltage $U_g$ on the drain side and the gate side. At its source side this transistor 36 is connected both to the gate line 29 and to the drain line of a further highly ohmic field effect transistor 35, whereas the source of this transistor 35 is connected to earth. When a positive voltage $U_I = U_1$ of e.g. 10 V is connected to the gate of the field effect transistor 35, the transistor 35 is switched through. Together with the transistor 35, the transistor 36 forms an inverter which serves to operate the gate line. When the field effect transistor 35 is blocked, the gate line 29 consequently carries the voltage $U_G \approx U_g$. $U_G$ is lower than $U_g$ by the amount of the threshold voltage of transistor 36. Since, in the current-traversed state, the inner resistance of the transistor 36 is high relative to that of the transistor 35, when the transistor 35 is switched through the control line 29 carries the potential $U_G \approx 0$ V. The gate line 30 is operated similarly to the gate line 29, which has not been represented in FIG. 3, however.

The bit-wise operation of the source lines is carried out similarly to the operation of the gate line. In the corresponding part of the description it is merely necessary to replace $U_g$ by $U_s$; 36 by 38; 35 by 37; $U_I$ by $U_{II}$ and the word "gate"—where this relates to the transistors 21, 25—by the word "source". When the transistor 37 is blocked, the voltage $U_S \approx U_s$ is connected to the source line 31, whereas when the transistor 37 is switched through the voltage $U_S \approx 0$ is connected to the source line 31. This similarly applies to the source line 32, the operation of which is not illustrated in FIG. 3. On one side the drain line 33 is connected to a diffusion zone of a field effect transistor 39, whereas the gate and the second diffusion zone of the transistor 39 are connected to a voltage $U_d$. $U_d$ amounts to approximately 5 V. If either the transistors 21, 25 or the transistors 23, 27 are switched through by suitable potentials at source and drain, the drain line 33 carries approximately the potential of the source line 31. This similarly applies to the drain line 34 as to the source line 32.

The function of a memory corresponding to the invention will be explained in detail making reference to FIG. 3 and the table. With regard to the table, it should be noted that the first column indicates the serial row number, the second heading "process in the memory" indicates what is to be carried out in the memory, e.g. erasure or recording. The third heading "word selection" indicates whether the cell in question belongs to a selected word designated by "word" or to a non-selected word designated by "$\overline{word}$". In the heading "information in the memory cells" a "1" signifies that the cell in question contains an item of information, i.e. that the floating gate of the cell in question is electrically charged, whereas a "0" signifies that the cell in question contains no information, i.e. the floating gate of the associated cell is not electrically charged. The designations "$U_I$, $U_{II}$, $U_G$, $U_S$, $U_D$" have already been explained in detail in the description of FIG. 3. $U_1$ and $U_2$ are positive voltages of e.g. 10 V. $U_p$ is likewise a positive voltage which is defined by $U_G - U_S$ in row 3 of the table, and amounts to 30 V–40 V. If a sufficiently strong negative voltage occurs for $U_G - U_S$, an item of information is erased in the corresponding cell. If, on the other hand, a sufficiently large positive voltage occurs in this heading, an item of information is recorded into the corresponding cell. If the difference $U_G - U_S$ produces positive or negative values of a sufficiently small amount, or amounting to zero, an item of information is neither recorded nor erased in the cell in question.

If the first row of the table is considered, a word is to be erased in the memory, where the individual memory cells of the selected word can carry the information "1" or "0". For this purpose $U_I = U_1$ is selected, i.e. the field effect transistor 35 of FIG. 3 is switched through, i.e. the voltage $U_G \approx 0$ is connected to the gate line 29 of the selected word. In order to produce a voltage $U_S = U_p$ on all the source lines 31, 32 etc. of the selected word, the voltage $U_{II} = O$ must be selected across the gate of the transistor 37. As a result the source line 31 carries $U_S \approx U_p$. All the other source lines should be connected similarly to the source lines 31. As the value $U_G - U_S$ produces a negative value, namely $-U_p$, with a sufficiently high $U_p$, e.g. $U_p = 30$ to 40 V, the entire selected word is erased. In order to avoid a simultaneous erasure of adjacent words, the conditions of row number 2 must be established for all the storage cells of the adjacent words. This can be achieved in that all the gate lines of the adjacent words, e.g. the gate line 30 from FIG. 3, are connected to the same potential to which all the source lines have been connected in order to erase the selected word. The value $U_G - U_S$ of all the non-selected words thus produces the value zero, i.e. an item of information is neither erased nor recorded in all the cells of the non-selected words. Since the gates possess a positive voltage $U_P$ in the case of the non-selected words, the transistors of the cells of a non-selected word, thus in FIG. 3 the transistors 23, 27 and 24, 28 are switched through. Thus the associated drain lines 33, 34 carry approximately the same potentials as the source lines 31, 32 in conformity with the values of $U_D$ in the first and second rows of the table.

Row 3 of the table indicates the conditions for the recording of the information "1". For this purpose a positive voltage $U_P$ must be connected to the gate line of the cell in which recording is to be made, e.g. to the gate line 29 of the cell 41 in FIG. 3. This can be achieved in that the transistor 35 is blocked, thus $U_1 = 0$, whereas $U_g = U_P$ across the transistor 36. This results in the potential $U_G \approx U_P$ across the gate line 29. At the same time when the transistor 37 is switched through, i.e. when $U_{II} = U_2$, and when the transistor 38 is switched through, the source line 31 carries a voltage of $U_S = O$ V. The value $U_G - U_S \approx +U_P \approx 30$ V to 40 V is sufficient in order to record an item of information into the cell 41. For all the other cells of a selected word into which a "1" is likewise to the recorded, conditions similar to those shown in row 3 of the table are provided. For all the other cells of the selected word in which a "0" is to remain, the conditions of row 4 of the table are provided. In order to record the information "0" into cell 42, when a "1" has already been recorded into cell 41, the common control line 29 carries the voltage $U_P$. In order to obtain a "0" in the cell 42, a positive voltage of $\frac{2}{3} U_P$ can be connected to the source line which is achieved in that the transistor of the source line 32 which is analogous to the transistor 37 of the source line 31 is blocked, i.e. $U_{II}=0$. At the same time a voltage $U_s = \frac{2}{3} U_P$ is connected to the transistor which is similar to the transistor 38 of the source line 31. Thus the source line 32 possesses a positive voltage of $\frac{2}{3} U_P$. The transistors 22, 26 are thus switched through. Since the transistor of the drain line 34, which transistor is similar to the transistor 39, has been connected to a low positive voltage of +5 V, although the source line 32 carries a potential of approximately 20 V, this field effect transistor is blocked and the voltage across the drain line 34 likewise amounts to $\frac{2}{3} U_P$. In order to avoid disturbance of neighboring words, all the cells of non-selected words which are contained in the same bit column of a "1" to be recorded in accordance with row 3 of the table, should be provided with the conditions of row 5, whereas all the other cells of non-selected words should be provided with the conditions of row 6. As can be seen, the conditions of rows 5 and 6 with the conditions already set in accordance with row 3 and 4 of the table are produced when additionally all the gate lines of the non-selected words are operated with a voltage $U_G = \frac{1}{3} U_P$. The voltage operation is carried out similarly as described above, in that in the case of non-selected words the voltage $U_g = \frac{1}{3} U_P$ is selected, while the second transistor connected to corresponding gate lines is blocked.

Memories corresponding to the invention can be used as program memories, e.g. as program memories in the television or telephone field.

| Line NO. | Process in the Store | Word Selection | Information in the Storage Cells | $U_I$ | $U_{II}$ | $U_G$ | $U_S$ | $U_D$ | $U_G-U_S$ |
|---|---|---|---|---|---|---|---|---|---|
| 1 | Erasure | Word | 1 or 0 | $U_1$ | 0 | 0 | $U_P$ | $U_P$ | $-U_P$ |
| 2 | " | $\overline{\text{Word}}$ | 1 or 0 | 0 | 0 | $U_P$ | $U_P$ | $U_P$ | 0 |
| 3 | Writing | Word | 1 | 0 | $U_2$ | $U_P$ | 0 | 0 | $+U_P$ |
| 4 | " | Word | 0 | 0 | 0 | $U_P$ | $\frac{2}{3} U_P$ | $\frac{2}{3} U_P$ | $+\frac{1}{3} U_P$ |
| 5 | " | $\overline{\text{Word}}$ | 1 | 0 | $U_2$ | $\frac{1}{3} U_P$ | 0 | 0 | $\frac{1}{3} U_P$ |
| 6 | " | $\overline{\text{Word}}$ | 0 | 0 | 0 | $\frac{1}{3} U_P$ | $\frac{2}{3} U_P$ | $\frac{2}{3} U_P$ | $-\frac{1}{3} U_P$ |

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A memory comrising: a plurality of addressable individual storage cells; each cell having at least one field effect transistor (FET) with a floating storage gate entirely surrounded by an insulating layer and which is electrically floating, and with a further insulated controllable control gate, the storage gate and control gate being arranged over a substrate of given lattice temperature and having a channel zone of the FET therein and with the insulating layer being arranged on the substrate; the FET having erasure means for discharge of the floating gate by means of a physical mechanism comprising a direct transfer of electrons from the floating gate through the insulating layer under the influence of a strong connected electrical field resulting by connecting a high voltage between the storage gate and the substrate; the FET having programming means for charging of the floating gate by the same physical mechanism as the erasure of the FET; the programming and erasure means carrying out transfer of electrons during programming and erasure at a same transfer region of the insulating layer but in opposite directions, the electrons which are transferred during programming and erasure having a temperature substantially the same as the substrate lattice temperature; and a capacitance between the control gate and the floating gate being high relative to a capacitance between the floating gate and the channel zone and a capacitance between the floating gate and the substrate at the transfer region at which the transfer of electrons takes place.

2. A memory as claimed in claim 1 in which the transfer region of the insulating layer of the field effect transistor has a smaller layer thickness than remaining portions of the insulating layer above the channel zone.

3. A memory as claimed in claim 1 in which the insulating layer in the transfer region has a layer thickness of 200 Å to 700 Å and other portions of the insulating layer above the channel zone have a layer thickness of 800 Å to 1200 Å.

4. A memory as claimed in claim 1 in which the transfer region is arranged laterally adjacent the channel zone of the FET.

5. A memory as claimed in claim 1 in which the transfer region is arranged over the channel zone.

6. A memory as claimed in claim 4 in which the transfer region is between a source of the FET and the floating gate.

7. A memory as claimed in claim 4 in which the transfer region is between a drain of the FET and the floating gate.

8. A memory as claimed in claim 5 in which the transfer region is between a source of the FET and the floating gate.

9. A memory as claimed in claim 5 in which the transfer region is between a drain of the FET and the floating gate.

10. A memory as claimed in claim 1 in which the insulating layer is comprised of an oxide of a semiconductor material used as the substrate.

11. A memory as claimed in claim 1 in which the insulating layer is comprised of a nitride of a semiconductor material used as the substrate.

12. A memory as claimed in claim 1 in which the floating gate is comprised of doped polycrystalline semiconductor material.

13. A memory as claimed in claim 1 in which the control gate is comprised of a metal.

14. A memory as claimed in claim 1 in which the individual field effect transistors are monolithically integrated in the same substrate, said substrate comprising silicon.

15. A memory as claimed in claim 1 in which each memory cell has a split control gate structure so as to form two FETs controlled by the same control gate.

16. A memory as claimed in claim 1 in which gate lines are provided connecting to the control gate as word lines, and source and drain lines are provided respectively connecting to sources and drains of the FETs as bit lines.

17. A memory as claimed in claim 16 in which the bit lines comprise aluminum and the word lines comprise doped polycrystalline silicon.

18. A memory as claimed in claim 16 in which the bit lines comprise diffusion paths and the word lines comprise aluminum.

19. A method of writing and erasing in storage field effect transistors (FETs) which form storage cells of a memory, a gate line connecting to control gates of the field effect transistors and a source line and a drain line respectively connecting to sources and drains of the FETs, and each FET having an electrically floating storage gate between the control gate and a substrate of the FET, comprising the steps of:

(a) erasing in a given storage cell by direct transfer of electrons from the floating gate through the insulating layer at a specified transfer region to the substrate, the electrons transferred having a temperature substantially that of a lattice temperature of the substrate; and (b) writing in a given storage cell by direct transfer of electrons to the floating gate through the insulating layer at said specified transfer region from the substrate, the electrons transferred having the lattice temperature.

20. The method of claim 19 comprising the steps of erasing a selected word by connecting a potential of 0 Volts to a gate line of the selected word and connecting a higher positive voltage to the source lines.

21. A method as claimed in claim 20 comprising the steps of providing an insulating layer thickness at the transfer region of 200 Å to 700 Å and selecting the higher positive voltage in a range 20 V to 40 V.

22. A method as claimed in claim 19 including the steps of connecting a first voltage to the gate line and a second voltage to the source line for a selected word, the first and second voltages not being independent of one another.

23. A method as claimed in claim 19 wherein for recording a "1" and a "0" into an individual storage cell of a selected word, feeding a gate line of the selected word in each case with a given high positive voltage and feeding gate lines of non-selected words with $\frac{1}{3}$ the given voltage, and at the same time for recording a "1" in the storage cell connecting a potential of 0 Volts to the associated source line and for recording a "0" in the storage cell connecting a potential of $\frac{2}{3}$ the given voltage to the associated source line.

24. A method of writing and erasing in storage field effect transistors which form storage cells of a memory, each storage cell field effect transistor having an electrically floating storage gate between a control gate and a substrate of the field effect transistor (FET), comprising the steps of: erasing and programming the storage cells by a same physical mechanism of applying a voltage between the memory gate and substrate of a magnitude sufficient to cause electrons having a temperature substantially the same as a lattice temperature of the substrate to cross over during programming from the substrate to the floating gate and during erasing from the floating gate through the insulating layer to the substrate; and wherein the erasing and programming by the electron cross-over occurs at substantially the same location of the insulator layer in the opposite direction for erasing vis-a-vis programming.

* * * * *